(12) United States Patent
Allen et al.

(10) Patent No.: US 6,452,393 B1
(45) Date of Patent: Sep. 17, 2002

(54) NUCLEAR MAGNETIC RESONANCE BIRDCAGE COIL WITH CASSINIAN OVAL FORMER

(75) Inventors: Peter S. Allen, Spruce Grove; Nicola De Zanche, Edmonton, both of (CA)

(73) Assignee: University of Alberta, Edmonton (CA)

(*) Notice: Subject to any disclaimer, the term of this patent is extended or adjusted under 35 U.S.C. 154(b) by 0 days.

(21) Appl. No.: 09/579,517

(22) Filed: Apr. 13, 2000

Related U.S. Application Data
(60) Provisional application No. 60/129,735, filed on Apr. 16, 1999.

(51) Int. Cl.[7] .................................................. F02P 17/00
(52) U.S. Cl. ..................... 324/318; 324/307; 324/309; 324/320; 324/322
(58) Field of Search ................................ 324/318, 322, 324/320, 307, 309

(56) References Cited

U.S. PATENT DOCUMENTS
5,986,454 A * 11/1999 Leifer ........................ 324/318

OTHER PUBLICATIONS
Liu, Q., Hughes, D.G., Allen, P.S., Improved Minimum–Inductance, Elliptic–Cylinder Z–Gradient Coil Using Axial and Azimuthal Current Flow. J. Magn. Reson., 113:228–235 (1996).

Liu, Q., Hughes, D.G., Allen, P.S., Design of an Elliptic–Cylinder Transverse–Gradient Coil of Minimum Inductance.

Petropoulos, L.S., Martens, M.A., Brown, R.W., Thompson, M.R., Morich, M.A., Patrick, J.L. An MRI Elliptical Coil with Minimum Inductance. Meas. Sci. Technol. 4:349–356 (1993).

Du, Y.P., Parker, D.L. Studies on the Performance of Circular and Elliptic Z–Gradient Coils Using a Simulated Annealing Algorithm. Magn. Reson. Med., 15:255–262 (1997).

Leifer, M.C. Theory of the Quadrature Elliptic Birdcage Coil. Magn. Reson. Med., 38:726–732 (1997).

Bimson, W.E., Martin, P.A., Griffiths, R.D., Edwards, R.H.T. An Elliptic Cross Section Birdcage Body Coil. Proc. 11th Annual Meeting of Society of Magnetis Resonance in Medicine, Berlin, Germany, 272 (1992).

Kurczewski, R., Pavlovich, R., Steidley, J.W., Rollins, N.K. Design of Elliptically Shaped Quadrature Pediatric Body Coils. Proc. 11th Annual Meeting of Society of Magnetis Resonance in Medicine, Berlin, Germany, 4025 (1992).

S. Li, Collins, C.M., Dardzinski, B.J., Chin, C–L, Smith, M.B. A Method to Create an Optimum Current Distribution and Homogenous B1 Field for Elliptical Birdcage Coils. Magn. Reson. Med., 37:600–608 (1997).

Hayes, C.E., Edelstein, W.A., Schenck, J.F., Mueller, O.M., Eash, M. An Efficient, Highly Homogeneous Radiofrequency Coil for Whole–Body NMR Imaging at 1.5T. J. Magn. Reson., 63:622–628 (1985).

* cited by examiner

*Primary Examiner*—Edward Lefkowitz
*Assistant Examiner*—Dixomara Vargas
(74) *Attorney, Agent, or Firm*—Fish & Richardson P.C.

(57) ABSTRACT

A shielded birdcage-type radiofrequency (RF) resonance coil having a non-circular cross-sectional shape corresponding to a Cassinian oval. The placement of longitudinal conducting elements in the former of the coil is determined numerically by conformal mapping of the equally distributed positions of the conductors in a circular coil onto a Cassinian oval.

11 Claims, 3 Drawing Sheets

Z (problem) plane

W (model) plane

NUCLEAR MAGNETIC RESONANCE BIRDCAGE COIL WITH CASSINIAN OVAL FORMER

CROSS-REFERENCE TO RELATED APPLICATION

This application claims priority to provisional patent application Ser. No. 60/129,735 filed April 16, 1999, the contents of which are incorporated herein.

BACKGROUND

The circularly cylindrical birdcage resonator is a popular radiofrequency (RF) transmission coil in magnetic resonance imaging (MRI) and magnetic resonance spectroscopy (MRS). Such birdcage coils are popular because they are able to produce a highly homogenous, circularly polarized RF magnetic field over a substantial fraction of the coil volume. Also, the circular cross section of gradient and RF coil sets provides satisfactory patient accommodation for most operations. Nevertheless, in certain cases the shape of the body poorly approximates a circular section, for example, the lower abdomen, head, and shoulders. For such applications, it may be advantageous to change the cross-sectional shape of the coil.

Another reason to tailor the coil shape is economic. Increasing the field strength and increasing the bore diameter are conflicting requirements in magnet construction. At any given field strength, smaller bore magnets are cheaper to build, site, and operate. However, when measuring certain body regions that do not approximate a circular shape, such as the shoulders, circular coils present a significant amount of unfilled space about the body being measured, that is, the coil is characterized by a low filling factor. Tailoring the geometry of the coil cross-section for certain body regions may reduce the overall size and increase the filling factor of the coil.

An important consideration in the construction of a birdcage coil is the homogeneity of the magnetic field in the coil. The homogeneity of the field in the coil depends in large part on the azimuthal placement of the longitudinal conducting elements about the inner diameter of the coil. In circular coils, the longitudinal elements are evenly spaced and placement of the elements is relatively straightforward. However, this may not be the case for non-circular coils. Thus, an important consideration in the design of non-circular coils is the azimuthal positioning of the longitudinal elements.

SUMMARY

According to an embodiment, a nuclear magnetic resonance coil includes an electrically conductive coil configured for use in a nuclear magnetic resonance device. The coil has a cross-sectional area substantially in the shape of a first Cassinian oval.

According to another embodiment, the electrically conductive coil includes a cylindrical body with a cross-sectional area substantially in the shape of a Cassinian oval, and a conducting shield with a cross-sectional area substantially in the shape of another Cassinian oval is formed around the cylindrical body.

According to another embodiment, the electrically conductive coil includes a number of longitudinal conducting elements coupled to a face of the cylindrical body, extending along a length of the cylindrical body. Each of the longitudinal conducting elements has an azimuthal position on the Cassinian oval corresponding to a conformal transformation of an associated position on a corresponding circular coil.

According to another embodiment, a number of charge storage elements are provided, each charge storage element electrically connected to at least a particular one of the plurality of longitudinal conducting elements.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Radiofrequency (RF) coils used in nuclear magnetic resonance (NMR) measurements deliver RF energy to, and receive a signal from, nuclei in the sample or patient being studied. Such coils must resonate at the Larmor frequency of the particular type of nucleus of interest (e.g., 128 MHz for protons at 3 T). The birdcage resonator has the ability to produce a very uniform, circularly-polarized field at its interior, exciting and receiving the signal with a satisfactory uniformity.

Figure 1:
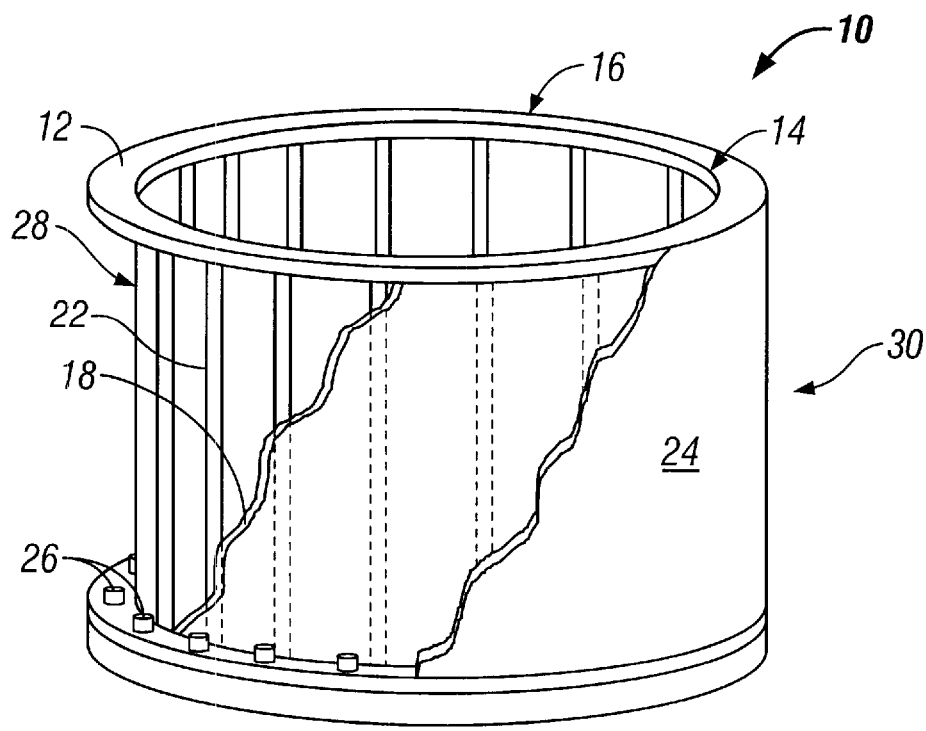
FIG. 1 is a partial sectional view of an RF coil according to one embodiment.

FIG. 1 illustrates a non-circular NMR birdcage coil 10 according to one embodiment of the invention. Two supporting end rings 12 have inner 14 and outer 16 edges corresponding to confocal Cassinian ovals. A Cassinian oval is defined as the locus of a point such that the product of its distances from two fixed points, i.e., foci, is constant. Inner 18 and outer 20 flexible rectangular sheets are wrapped around the inside and outside edges of the end rings 12. The inner flexible sheet 18 assumes the desired Cassinian cylindrical shape, providing a former 28 on which the longitudinal conducting elements 22 are fastened. The outer flexible sheet 20, to which a foil layer 24 is attached, assumes the desired Cassinian cylindrical shape of a shield 30. The longitudinal elements 22 are joined in a resonant ladder network that includes capacitors 26 which join the ends of the longitudinal elements.

According to the present embodiment, the end rings 12 are machined from a ½ inch thick polycarbonate sheet. The inner edges 14 of each end ring 12 approximate a Cassinian oval that corresponds to the former 28, and the outer edges 16 approximate a Cassinian oval that corresponds to the shield 30. Other suitable materials for the end rings include, for example, Teflon or Kevlar.

According to the present embodiment, the former 28 has a major diameter of about 28 cm and a minor diameter of about 22 cm. The shield 30 has a major diameter of about 32.5 cm. This value is chosen based on the access diameter of the gradient coil. The shield has a minor diameter of about 27.56 cm, which is determined based on the previous three dimensions.

According to the present embodiment, the former 28 and shield 30 are constructed by wrapping two thin rectangular sheets (approximately 1 mm thick) of polycarbonate around the inside and outside edges of the end rings 12. The inner flexible sheet therefore assumes, to a good level of accuracy (±0.5 mm), the desired Cassinian cylindrical shape of the former 28, and the outer flexible sheet assumes the desired Cassinian cylindrical shape of the shield 30.

Figure 2:
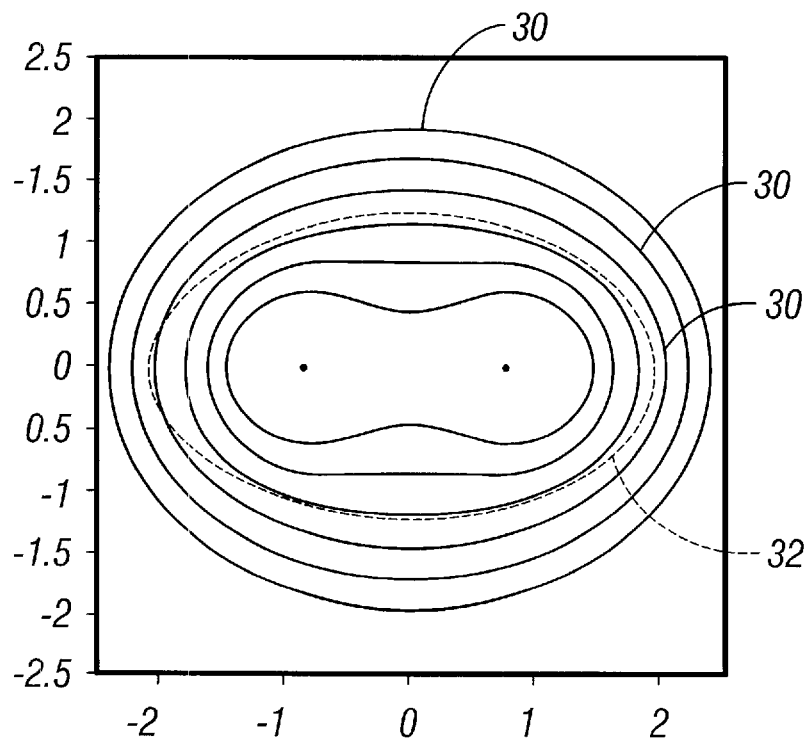
FIG. 2 is a graph illustrating a family of Cassinian ovals corresponding to cross-sectional shapes of RF coils according to various embodiments, and a ellipse.

The cross-sectional shape of the former 28 approximates a Cassinian oval. As described above, an oval of Cassini is defined as the locus of a point such that the product of its distances from two fixed points (foci) is constant. A family of such curves 30 is shown in FIG. 2. It was first studied by Italian astronomer Giovanni Domenico Cassini in the seventeenth century to explain the motion of the planets. Also shown in FIG. 2 is an ellipse 32 for comparison. An advantage of the Cassinian oval over the ellipse 32 lies in it having a more regular curvature even for large aspect ratios.

Cassinian ovals resemble the anthropomorphic means of some body shapes including, for example, the head, shoulders and thoracic and pelvic regions.

Coil 10 according to the present embodiment may better approximate the shape of the body part being examined, thus increasing the filling factor in the coil and providing closer coupling to the body between the transmit/receive coil and the body. Such closer coupling may improve signal-to-noise ratio (SNR) in the coil. Closely coupled coils require a smaller current than loosely coupled coils to produce a given excitation field amplitude. Accordingly, such coils may decrease demand requirements on the transmitting RF amplifier section of the system. This may result in a higher sensitivity on reception and therefore an increase in SNR.

Theoretically, a perfectly uniform transverse magnetic field inside an infinitely long cylinder may be created by an "ideal" continuous current distribution that flows in the axial direction but varies in amplitude in the azimuthal direction. In the conventional birdcage coil structure, i.e., circular, longitudinal conducting elements provide a discrete approximation of this ideal current distribution. To create, with these elements, a current distribution that varies appropriately in the azimuthal direction, the current elements are joined in a resonant ladder network that includes, in general, capacitors which not only join the ends of the longitudinal elements, but which may also be in series with the elements themselves. The longitudinal elements are positioned in the former in azimuthal positions that will provide a satisfactory field homogeneity in the interior of the coil.

In the case of a circular coil, the angular separation of the elements in the azimuthal direction is constant. The longitudinal elements are positioned to provide sinusoidally-distributed, evenly spaced currents running longitudinally along a circular cylinder to produce a uniform transverse magnetic field inside the cylinder.

According to the present embodiment, the azimuthal positioning of the elements to produce a satisfactorily uniform field may not be uniformly distributed. The desired azimuthal positions for an unshielded Cassinian birdcage coil may be determined numerically by mapping the positions of the evenly spaced conductors of a circular section coil onto their new positions on the Cassinian oval by means of a conformal transformation.

Conformal mapping is a known technique for two-dimensional static problems. In this technique, a complex value in the form $z = x + i*y$ is associated with each point of the two-dimensional plane, where x and y are the Cartesian coordinates. Thus, the location of a point is characterized by a complex number rather than by a pair of real numbers. When W(z) is an analytic solution of the Laplace equation for the scalar potential W in the complex w plane, one can apply a complex, conformal transformation $w = f(z)$. A mapping $w = f(z)$ is angle preserving, or conformal, if it preserves angles between oriented curves in magnitude as well as in orientation.

If one considers any grid in the w plane, the conformal transformation will change the shape, location, or orientation of the grid when mapped to the z plane. If the original grid lines are orthogonal, the transformed grid lines will also be orthogonal, provided that the transformation is conformal.

Figure 3A:
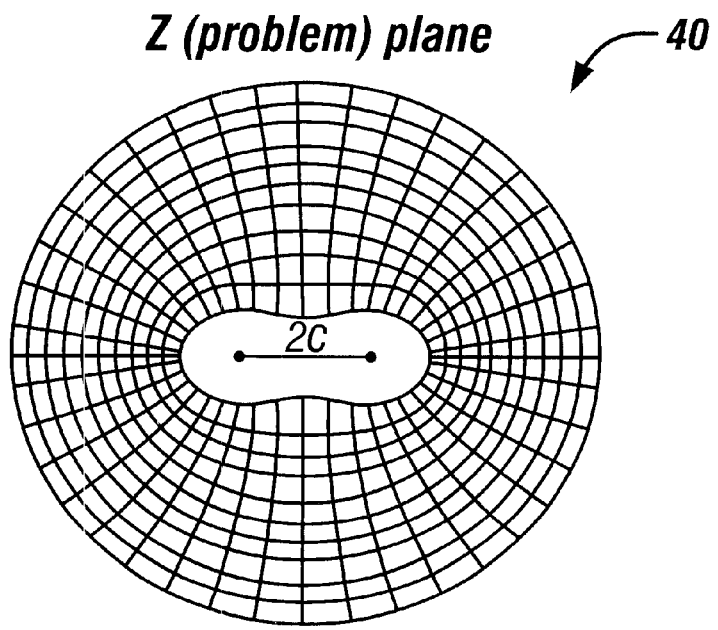
FIGS. 3A and 3B are diagrams illustrating a problem plane and a modal plane for a conformal mapping according to an embodiment.
Figure 3B:
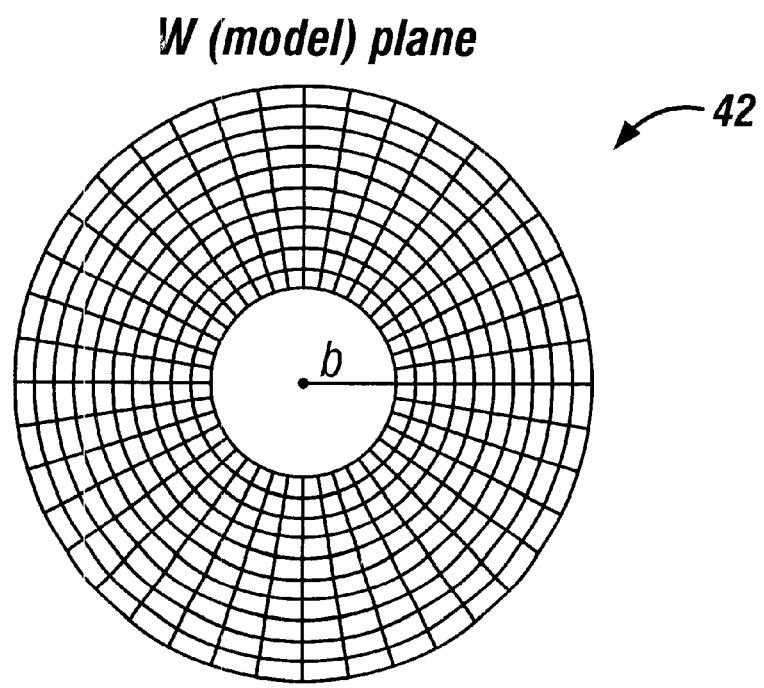

In the present embodiment, the azimuthal positions of elements on a circular coil are mapped onto the Cassinian oval using the following equation:

$$z = f(w) = w\sqrt{1 + \frac{c^2}{w^2}} \quad (1)$$

where z and w represent the complex form of spatial coordinates in the Cassinian 40 and the circle 42 planes, as shown in FIGS. 3A and 3B, respectively. The parameter c (½ distance between foci), together with the radius of the mapped circle, $b_1$, are determined from the size and shape of the Cassinian. The exact relationships between circle radius $b_1$, c, and the semi-axes $m_1$ and $n_1$ of the Cassinian former are as follows:

$$m_1 = \sqrt{b_1^2 + c^2} \quad (2)$$
$$n_1 = \sqrt{b_1^2 - c^2}.$$

In a shielded, non-circular birdcage coil, the quality of the resulting magnetic field may be determined by the cross-sectional shape of the shield as well as the azimuthal placement of the longitudinal current elements around the non-circular former. Generally, it is advantageous to determine both of these problems simultaneously because the shield shape directly influences the field produced by individual elements.

The presence of uncontrolled electromagnetic boundaries, such as those due to the other components of an NMR system, could, in general, alter the field distribution arising from a particular placement of the birdcage elements on the supporting surface. A conducting shield surrounding the birdcage resonator provides, among other advantages, a set of boundary conditions that are predictable and repeatable since it becomes an integral part of the RF coil system. A shielded system allows the current and field distribution to be more easily and reliably modeled than would be possible without a shield, and it also allows the shield's shape to be carefully chosen to maintain good field homogeneity.

To determine what shield shape will minimally perturb the field homogeneity that is obtainable for an isolated coil in free space, it is necessary to solve for the field of the shielded system under a variety of shield contours. In general, the solution of this boundary value problem does not have a closed-form solution. If, however, the effects of finite coil length are neglected, and the shield section is restricted to a family of curves for which there exists a conformal mapping that will transform their interior into circles, analytical expressions for the field are obtainable.

Preferably the shield has a Cassinian oval cross section to account for the boundary conditions. The transformation given by:

$$g(w) = \sqrt{\frac{pw^2}{p-w^2}} \, \text{sign}[\text{Re}\{w\}], \quad (3)$$

is known and readily calculated, without requiring the numerical approximation of special functions as is the case for shields of elliptical cross section. The relationships between shield semi-axes $m_2$ and $n_2$, and the transformation parameter p and the radius r of the resulting circle, are given by:

$$r^2 = \frac{2m_2^2 n_2^2}{m_2^2 + n_2^2} \quad (4)$$

$$p = \frac{2m_2^2 n_2^2}{m_2^2 - n_2^2}$$

Using this transformation, the field due to a line current within a shield of Cassinian oval cross section may be obtained by mapping the known solution for the field due to a line current within a circular shield. The total field due to all the line elements is then obtained by superposition of the fields produced by the single-element currents.

The present embodiment provides a homogeneous field by using the same elemental placing scheme as in the unshielded case. The coil 10 is enclosed in confocal Cassinian shield 30. The oval of the shield 30 may be obtained by mapping, using function f of Equation 1, a circle of radius $b_2 > b_1$ that is concentric with the one that maps to the former 28. The dimensions of the shield's semi-axes can be calculated using Equation 2, where the subscripts 1 are now substituted with a 2 to indicate the shield.

Figure 4A:
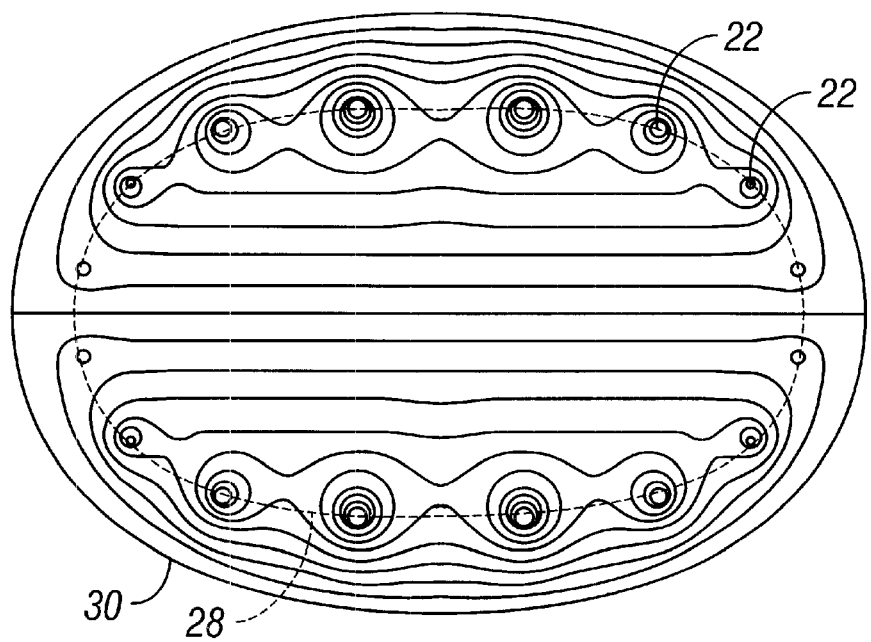
FIGS. 4A and 4B are diagrams illustrating magnetic field lines for a horizontal mode and a vertical mode, respectively, according to an embodiment.
Figure 4B:
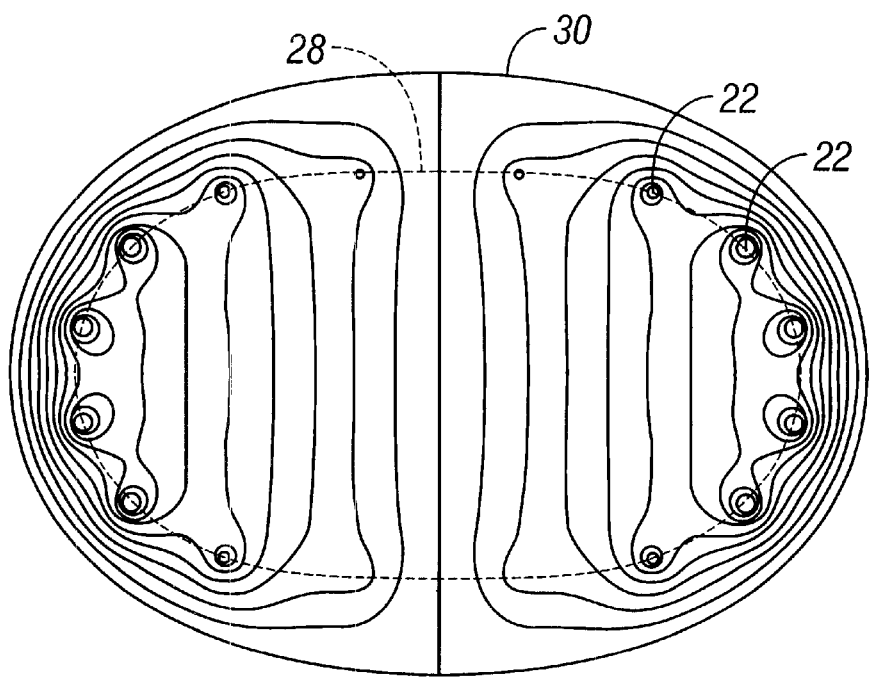

FIGS. 4A and 4B illustrate sample field plots for the two orthogonal modes. FIG. 4A illustrates magnetic field lines for a horizontal mode, and FIG. 4A illustrates magnetic field lines for a vertical mode.

The present embodiment includes sixteen longitudinal elements 22. The positions of the elements in the first quadrant, in Cartesian coordinates, are about:

| X (cm) | Y (cm) |
|---|---|
| 13.74 | 2.21 |
| 11.71 | 6.25 |
| 7.91 | 9.26 |
| 2.81 | 10.81 |

The positions of the other elements may be determined by symmetry.

The longitudinal elements may be self-adhering copper strips fastened to the inner flexible sheet. The longitudinal elements may also be, for example, copper impregnated on a Teflon surface or free standing copper tubes without an inner sheet for support.

The shield according to the present embodiment is a copper foil sheet 24 applied to the outer flexible sheet. Other suitable materials for the shield include, for example, slotted copper sheet designed to minimize gradient switching eddy currents.

The appropriate capacitance values for capacitors 26 are subsequently determined from measured or calculated inductance values by following the same method described in "Theory of the quadrature elliptic birdcage coil", M. C. Leifer, Magn. Reson. Med., 38, pp.726–732 (1997), hereby incorporated by reference, for the elliptical birdcage coil. The capacitors 26 are soldered to the longitudinal elements 22. Fine tuning is accomplished by adjusting small variable capacitors.

The dimensions of the former 28 of the present embodiment approximate the mean dimensions of the human head. According to alternate embodiments, coils of different sizes, corresponding to the anthropomorphic means of other body parts, are constructed, and the azimuthal positions of the longitudinal elements determined by mapping those positions from appropriately sized circular planes onto non-circular (Cassinian) planes.

The birdcage coil 10 of the present embodiment is tuned to a proton frequency of about 128 MHz at 3T. Other suitable operating frequencies include, for example, about 64 MHz at 1.5 T.

Determining the placement of longitudinal conducting elements according to the various embodiments of the invention is applicable to any coil design that is able to produce appropriate sinusoidally distributed currents. For example, the coil may be a TEM coil that employs a circuit where, unlike a birdcage coil, the longitudinal elements are not conductively connected to each other, but rather only to an outer cylindrical shield through the adjustable distributed capacitances.

The coils described herein are substantially in the shape of Cassinian ovals or quartic. Slight deviations may be acceptable.

A number of embodiments of the invention have been described. Nevertheless, it will be understood that various modifications may be made without departing from the spirit and scope of the invention. Accordingly, other embodiments are within the scope of the following claims.

What is claimed is:

1. A nuclear magnetic resonance coil comprising:
   an electrically conductive coil configured for use in a nuclear magnetic resonance device, the coil having a cross-sectional area substantially in the shape of a first Cassinian oval.

2. The nuclear magnetic resonance coil of claim 1 wherein the electrically conductive coil comprises a first cylindrical body having a cross-sectional area substantially in the shape of said first Cassinian oval.

3. The nuclear magnetic resonance coil of claim 2 further comprising a conducting shield formed around at least a portion of the outer layer of the first cylindrical body.

4. The nuclear magnetic resonance coil of claim 3 wherein the conducting shield comprises a second cylindrical body having a cross-sectional area substanitially in the shape of a second Cassinian oval, said first and second Cassinian ovals being substantially confocal.

5. The nuclear magnetic resonance coil of claim 2 further comprising a plurality of longitudinal conducting elements coupled to a face of said first cylindrical body and extending along a length of the first cylindrical body, each of said longitudinal conducting elements having an azimuthal position on the Cassinian oval corresponding to a conformal transformation of an associated position on a corresponding circular coil.

6. The nuclear magnetic resonance coil of claim 5 comprising sixteen longitudinal conducting elements.

7. A nuclear magnetic resonance coil comprising:
   a first cylindrical body having a cross-sectional area substantially in the shape of a first Cassinian oval;

a plurality of longitudinal conducting elements coupled to the first cylindrical body at azimuthal positions corresponding to a conformal mapping of an associated azimuthal position on a corresponding circular coil; and a plurality of charge storage elements, each charge storage element electrically connected to at least a particular one of said plurality of longitudinal conducting elements.

8. The nuclear magnetic resonance coil of claim 7 wherein the plurality of longitudinal elements comprise copper strips.

9. The nuclear magnetic resonance coil of claim 7 further comprising a shield comprising:

a second cylindrical body formed around at least a portion of the first cylindrical body, said second cylindrical body having a cross-sectional area substantially in the shape of a second Cassinian oval, wherein said first and second Cassinian ovals are substantially confocal; and a conductive layer coupled to one face of the second cylindrical body.

10. The nuclear magnetic resonance coil of claim 9 wherein the azimuthal positions of the plurality of longitudinal conducting elements correspond to a conformal mapping further including boundary conditions produced by the shield.

11. The nuclear magnetic resonance coil of claim 9 further comprising two end rings positioned adjacent opposing ends of the first cylindrical body, said first and second cylindrical bodies being connected to each of said first and second end rings.

* * * * *